US010242728B2

(12) United States Patent
Li et al.

(10) Patent No.: US 10,242,728 B2
(45) Date of Patent: Mar. 26, 2019

(54) DPU ARCHITECTURE

(71) Applicant: Samsung Electronics Co., Ltd., Suwon-si, Gyeonggi-do (KR)

(72) Inventors: Shaungchen Li, Goleta, CA (US); Dimin Niu, Sunnyvale, CA (US); Krishna Malladi, San Jose, CA (US); Hongzhong Zheng, Los Gatos, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/426,033

(22) Filed: Feb. 6, 2017

(65) Prior Publication Data

US 2018/0122456 A1    May 3, 2018

Related U.S. Application Data

(60) Provisional application No. 62/413,977, filed on Oct. 27, 2016, provisional application No. 62/418,155, filed on Nov. 4, 2016.

(51) Int. Cl.
*G06F 12/00* (2006.01)
*G11C 11/406* (2006.01)
(Continued)

(52) U.S. Cl.
CPC .......... *G11C 11/40622* (2013.01); *G06F 9/38* (2013.01); *G06F 12/00* (2013.01);
(Continued)

(58) Field of Classification Search
CPC .. G06F 15/7867; G06F 15/80; G06F 15/8046; G06F 13/1694; G06F 3/0629;
(Continued)

(56) References Cited

U.S. PATENT DOCUMENTS 5,838,165 A * 11/1998 Chatter ............... G06F 15/7867
326/38
7,602,214 B2 * 10/2009 Vorbach ............... G06F 15/7867
326/38
(Continued)

OTHER PUBLICATIONS

Hemsoth, Nicole, "The Next Wave of Deep Learning Architectures", The Next Platform, website (http://www.nextplatform.com/2016/09/07/next-wave-deep-learning-architectures/), Sep. 7, 2016 (5 pages).
(Continued)

*Primary Examiner* — Hiep T Nguyen
(74) *Attorney, Agent, or Firm* — Renaissance IP Law Group LLP

(57) ABSTRACT

A dynamic random access memory (DRAM) processing unit (DPU) may include at least one computing cell array having a plurality of DRAM-based computing cells arranged in an array having at least one column in which the at least one column may include at least three rows of DRAM-based computing cells configured to provide a logic function that operates on a first and a second row of the at least three rows and configured to store a result of the logic function in a third row of the at least three rows; and a controller that may be coupled to the at least one computing cell array to configure the at least one computing cell array to perform a DPU operation.

20 Claims, 12 Drawing Sheets

(51) Int. Cl.
*G06F 15/80* (2006.01)
*G06F 9/38* (2018.01)
*G11C 7/10* (2006.01)
*G11C 11/405* (2006.01)
*G11C 11/4076* (2006.01)
*G11C 11/4091* (2006.01)
*G11C 11/4096* (2006.01)
*G06F 15/78* (2006.01)

(52) U.S. Cl.
CPC .......... *G06F 15/7821* (2013.01); *G06F 15/80* (2013.01); *G11C 7/1006* (2013.01); *G11C 7/1012* (2013.01); *G11C 11/405* (2013.01); *G11C 11/4076* (2013.01); *G11C 11/4091* (2013.01); *G11C 11/4096* (2013.01)

(58) Field of Classification Search
CPC .............. G06F 17/5054; G06F 9/30101; G06F 9/30134; G06F 12/00; G06F 15/7821; G06F 9/38; G06F 7/1006; G06F 7/1012; G11C 15/043; G11C 16/10; G11C 29/78; G11C 11/40622; G11C 11/405; G11C 11/4076; G11C 11/4091; G11C 11/4096; G11C 11/7821
See application file for complete search history.

(56) References Cited

U.S. PATENT DOCUMENTS

| | | | |
|---|---|---|---|
| 9,455,020 B2* | 9/2016 | Manning | G11C 11/4091 |
| 2011/0013442 A1* | 1/2011 | Akerib | G11C 15/043 |
| | | | 365/49.1 |
| 2011/0026323 A1* | 2/2011 | Luk | G11C 11/36 |
| | | | 365/175 |
| 2012/0063202 A1* | 3/2012 | Houston | G11C 11/403 |
| | | | 365/149 |
| 2016/0173102 A1* | 6/2016 | Gao | H03K 19/1776 |
| | | | 326/38 |
| 2016/0232951 A1* | 8/2016 | Shanbhag | G11C 7/12 |

OTHER PUBLICATIONS

Song, Lili et al., "C-Brain: A Deep Learning Accelerator that Tames the Diversity of CNNs through Adaptive Data-level Parallelization", DAC '16, Jun. 5, 2016 (6 pages).

Xu, Lifan et al., "Scaling Deep Learning on Multiple In-Memory Processors", AMD Research, Advanced Micro Devices, Inc. (7 pages).

* cited by examiner

DPU ARCHITECTURE

CROSS-REFERENCE TO RELATED APPLICATION

This patent application claims the priority benefit under 35 U.S.C. § 119(e) of U.S. Provisional Patent Application No. 62/413,977, filed on Oct. 27, 2016, the disclosure of which is incorporated herein by reference in its entirety.

BACKGROUND

Graphics Processing Unit (GPUs) and Tensor Processing Units (TPUs) are conventionally used for deep learning processing. Deep learning processing includes highly parallelized processing that may not be efficiently performed by GPUs or TPUs.

SUMMARY

An example embodiment provides a dynamic random access memory (DRAM) processing unit (DPU) that may include at least one computing cell array having a plurality of DRAM-based computing cells arranged in an array having at least one column in which the at least one column may include at least three rows of DRAM-based computing cells configured to provide a logic function that operates on a first and a second row of the at least three rows and configured to store a result of the logic function in a third row of the at least three rows; and a controller that may be coupled to the at least one computing cell array to configure the at least one computing cell array to perform a DPU operation.

An example embodiment provides a DPU that may include at least one computing cell array that may include a plurality of DRAM-based computing cells arranged in an array having at least one column in which the at least one column may include at least three rows of DRAM-based computing cells configured to provide a logic function that operates on a first row and a second row of the at least three rows and configured to store a result of the logic function in a third row of the at least three rows; at least one data cell array that may include at least one DRAM-based memory cell arranged in at least one column; and a controller coupled to the at least one computing cell array to configure the at least one computing cell array to perform a DPU operation and coupled to the at least one data cell array to perform a memory operation. In one embodiment, the DRAM-based computing cells of the at least one column each may include a three transistor, one capacitor (3T1C) DRAM memory cell, and the DRAM-based computing cells of the at least one column may provide a NOR logic function. In another embodiment, the DRAM-based computing cells of the at least one column each may include a one transistor, one capacitor (1T1C) DRAM memory cell, and each DRAM-based computing cell further may include an arithmetic logic unit (ALU) coupled to a bit line of the DRAM-based computing cell in which the ALU may provide the logic function.

An example embodiment provides a DPU that may include at least one computing cell array that may include a plurality of DRAM-based computing cells arranged in an array having at least one column in which the at least one column may include at least three rows of DRAM-based computing cells configured to provide a logic function that operates on a first row and a second row of the at least three rows and configured to store a result of the logic function in a third row of the at least three rows; at least one stochastic computing cell array that may include a plurality of DRAM-based stochastic computing cells arranged in an array having at least one column in which the at least one column may include at least three rows of DRAM-based stochastic computing cells configured to provide a logic function that operates on a first row and a second row of the at least three rows and configured to store a result of the logic function in a third row of the at least three rows; a controller coupled to the at least one computing cell array to configure the at least one computing cell array to perform a DPU operation and coupled to the at least one stochastic computing cell array to perform a stochastic logic operation.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1:
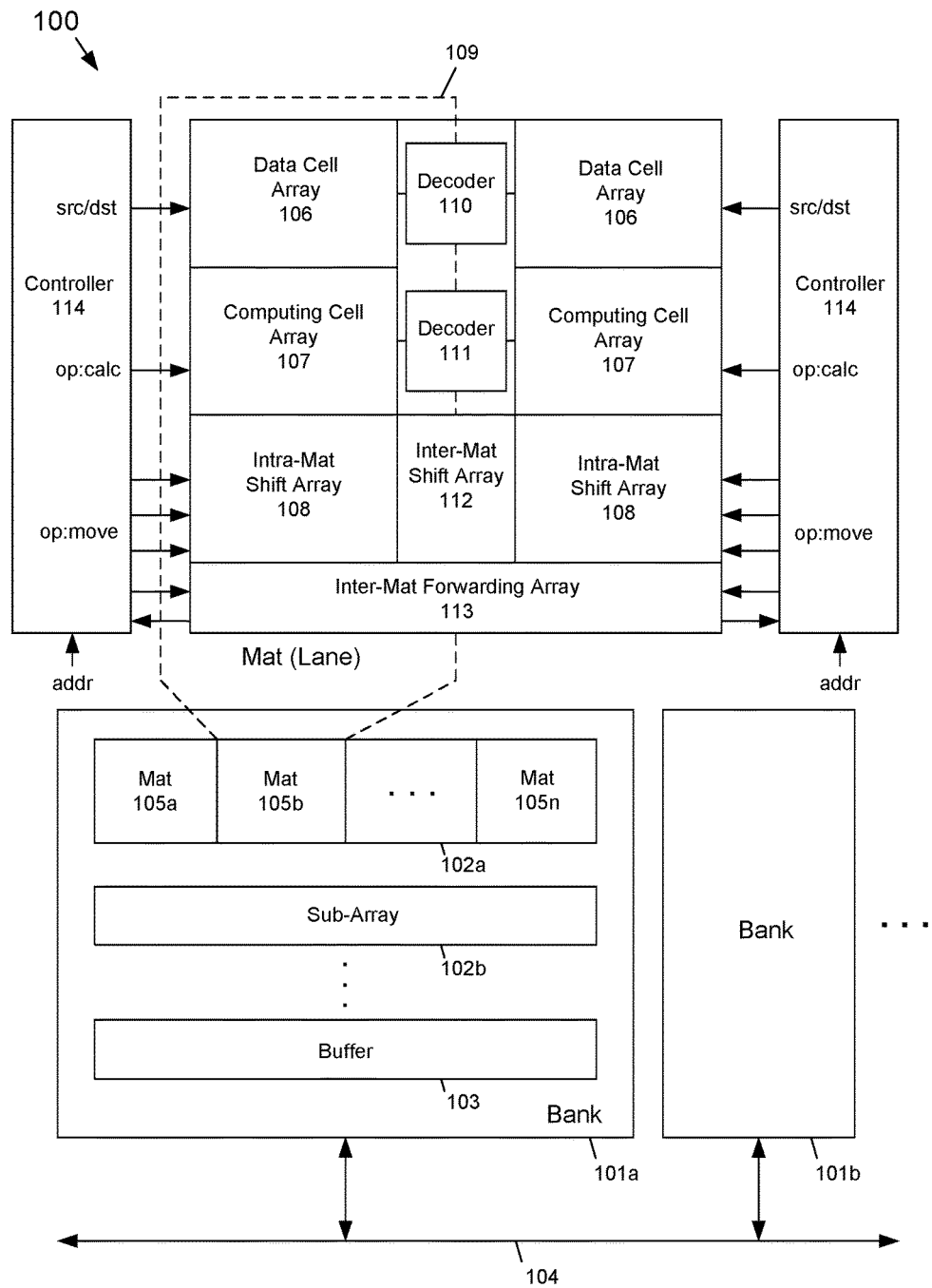
FIG. 1 depicts a block diagram of an example embodiment of a dynamic random access memory (DRAM) based processing unit (DPU) according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein provides a dynamic random access memory (DRAM) based processing unit (DPU) that is programmable and reconfigurable for different operations, such as, but not limited to adding, multiplying, shifting, max/min, and comparison. In one embodiment, a DPU is based on a three transistor, one capacitor (3T1C) DRAM process and structure. In another embodiment, a DPU is based on a one transistor, one capacitor (1T1C) DRAM process and structure with minor modifications. Accordingly, a DPU does not contain specific computing logic circuitry (like an adder), but provides computations using memory cells using highly parallel operations. In one embodiment, a DPU may include a stochastic computing array in which addition may be converted to a multiplexing operation and multiplication may be converted to an AND logic operation.

The subject matter disclosed herein also provides a system architecture that includes an environment (ecosystem) having framework extensions, a library, a driver, a compiler and an instruction set architecture (ISA) to program and reconfigure DPUs.

Additionally, the subject matter disclosed herein a system architecture that is suitable for to data center and/or mobile applications and that provides a Processor-in-Memory (PIM) solution for machine-learning applications for both binary and fixed point calculations that is an alternative to GPU/ASIC (TPU)/FPGA machine-learning applications. In one embodiment, the subject matter disclosed herein provides a high performance, energy efficiency, and low cost system that provides an accelerated deep learning for, for example, a Binary Weight Neural Network.

The subject matter disclosed herein relates to a DRAM-based processing unit (DPU) that may be formed using dynamic random access memory (DRAM) technology and that is reconfigurable and programmable. In one embodiment, a DPU may include a DRAM-based memory cell array and a DRAM-based computing cell array that may be configured to perform different operations, such as, add, multiply, sort, etc.

The internal architecture of a DPU may include a system bus that is connected to multiple banks of sub-arrays. In one embodiment, the system bus may be configured to provide H-tree-connected banks of sub-arrays. Each sub-array may include a local controller, and each individual sub-array may be separately or simultaneously activated. In one embodiment, the DRAM-based cells may be divided into two arrays—a data cell array and a computing cell array. In one embodiment, the computing cell array may be implemented by DRAM-based memory cells. In another embodiment, the computing cell array may be implemented by DRAM-based memory cells having logic circuitry. The DPU internal architecture also may include data-shifting and data-movement circuits. In some embodiments, there may be a third DRAM-based cell array that may be configured for stochastic data computations.

FIG. 1 depicts a block diagram of an example embodiment of a DPU 100 according to the subject matter disclosed herein. The DPU 100 may include one or more banks 101a-101m, of which only banks 101a and 101b are depicted in FIG. 1. Each bank 101 may include one or more sub-arrays 102a-102n, of which only sub-arrays 102a and 102b are depicted in FIG. 1. Each bank 101 may also include a buffer 103. The buffer 103 may be coupled to the individual sub-arrays 102 and to a system bus 104. The buffer 103 may read a whole row in a bank 102, and then write the row back to either the same bank or to another bank. The buffer 103 may also broadcast a copy of the row data to multiple mats 105a-105n in a sub-array 102. In one embodiment, the banks 101 and the system bus 104 may be configured to provide H-tree-connected banks.

Each sub-array 102 may include one or more mats (or lanes) 105, of which mats 105a-105n of mat 102a are depicted in FIG. 1. Each mat 105 is a region of a DPU 100 that may include a data cell array 106, a computing cell array 107 and an intra-mat shift array 108. An example mat 105 is indicated in FIG. 1 as being enclosed by a dashed line 109. Each mat 105 may share with a neighboring mat a data cell array decoder 110, a computing cell array decoder 111, an inter-mat shift array 112 and an inter-mat forwarding array 113. In one embodiment, a data cell array decoder 110, a computing cell array decoder 111 and an inter-mat shift array 112 may be alternately physically arranged with a sub-array controller 114 between neighboring mats 105. In one embodiment, the decoders 110 and 111 may operate as conventional DRAM-type memory decoders.

In one embodiment, each mat 105 is communicatively coupled to a sub-array controller 114. Each sub-array controller 114 may be configured to be independent from other sub-array controllers 114. A sub-array controller 114 may receive instructions as addresses (addr) from a DRAM address bus. In response to the addresses (i.e., address signals), a sub-array controller 114 may provide as an output a decoded address to either or both the data cell array 106 and the computing cell array 107. That is, a sub-array controller 114 may output source/destination (src/dst) addresses that are decoded by the decoder 110 for an associated data cell array 106, and in the case of the computing cell array 107, may output operation/calculation (op/calc) addresses that are decoded by the decoder 111. A sub-array controller 114 may also receive instructions as addresses from the DRAM bus that cause two or more sub-array controllers 114 to operate in a coordinated manner. The sub-array controller 114 may also control data movement circuits, such as controlling the intra-mat shift array 108, the inter-mat shift array 112 and the inter-mat forwarding array 113.

Each data cell array 106 may include one or more dynamic random access memory (DRAM) cells that are arranged in at least one column and at least one row. In one embodiment, a data cell array 106 may be configured as a conventional DRAM cell array. In one embodiment, a data cell array 106 may include 2K columns and 16 rows. In another embodiment, a data cell array 106 may include fewer or more than 2K columns and/or fewer or more than 16 rows.

Each computing cell array 107 may include one or more computing cells that are arranged in at least one column and at least one row. The number of columns in the computing cell array 107 is the same as the number of columns in the data cell array 106. In one embodiment, a computing cell array 107 may include 2K columns and 16 rows. In another embodiment, a computing cell array 107 may include fewer or more than 2K columns and/or fewer or more than 16 rows.

Figures 2A, 2B:
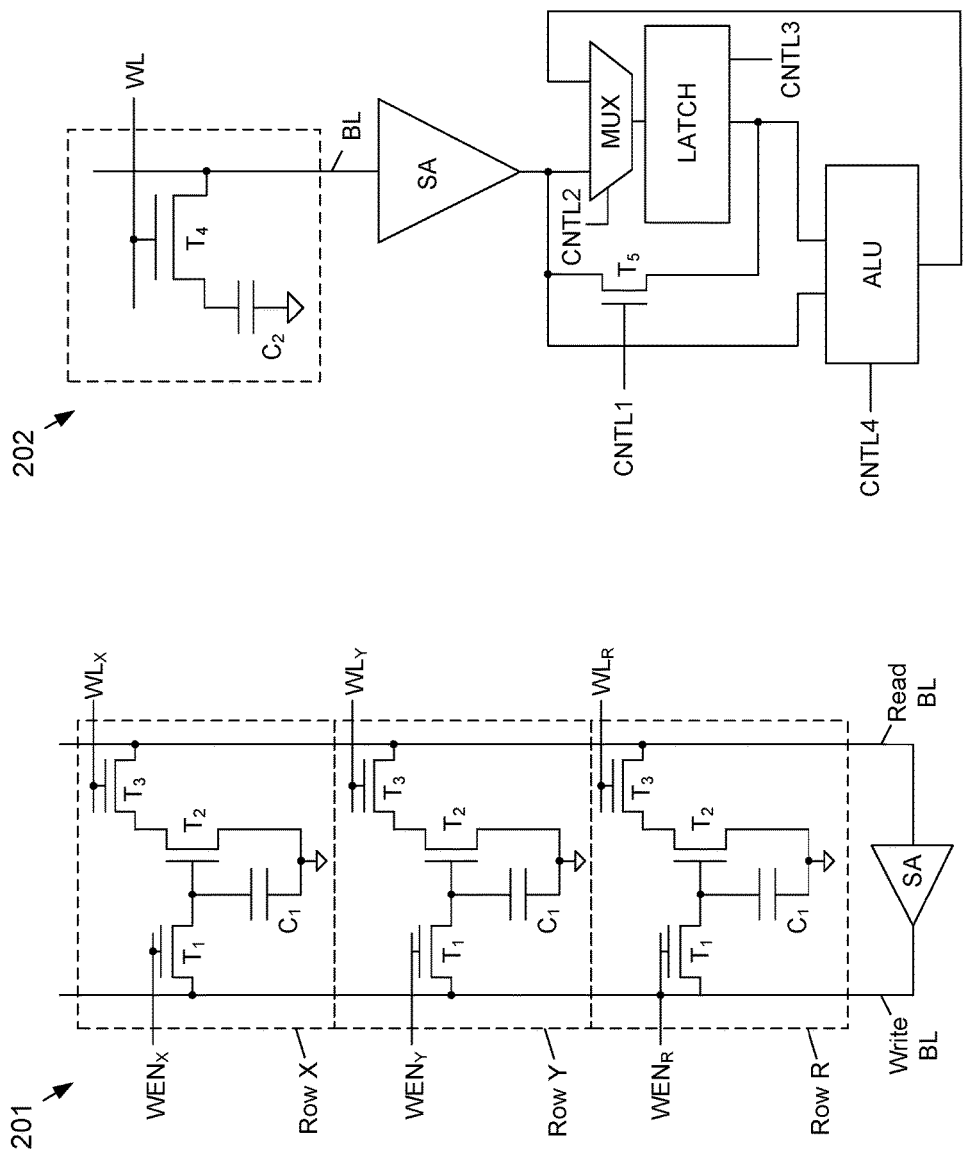
FIG. 2A depicts an example embodiment of a three-transistor, one-capacitor DRAM computing-cell topography that may be used for a computing cell in a computing cell array.
FIG. 2B depicts an alternative example embodiment of a one-transistor, one-capacitor DRAM computing-cell topography that may be used for a computing cell in the computing cell array.

FIG. 2A depicts an example embodiment of a three-transistor, one-capacitor (3T1C) DRAM computing-cell topography 201 that may be used for a computing cell in the computing cell array 107. As depicted in FIG. 2A, a 3T1C computing cell in a Row X includes a first transistor $T_1$ that has a source terminal that is electrically coupled to a write bit line (Write BL), a drain terminal that is electrically coupled to both a first terminal of a capacitor $C_1$ and a gate terminal of a second transistor $T_2$, and a gate terminal that is electrically coupled to a write enable (WEN) line. The second terminal of the capacitor $C_1$ is electrically coupled to a ground line. The transistor $T_2$ includes a source terminal that is electrically coupled to the ground line, and a drain terminal that is electrically coupled to a source terminal of a third transistor $T_3$. The third transistor $T_3$ includes a gate terminal that is electrically coupled to a word line (WL), and a drain terminal that is electrically coupled to a read bit line (Read BL). The 3T1C computing-cell topography 201 includes a sense amplifier SA having an input that is electrically coupled to the Read BL and an output that is electrically coupled to the Write BL.

A computing cell in a Row Y and a computing cell in a Row R may both also include three transistors $T_1$-$T_3$ and a capacitor C arranged in a 3T1C DRAM configuration similar to the arrangement of the computing-cell in Row X. The example three computing cells and the sense amplifier SA depicted in FIG. 2A are configured to provide a NOR logic operation, that is, an X NOR Y logic operation, in which the result is stored in Row R. Although only one column of 3T1C DRAM computing cells is explicitly depicted in FIG. 2A, it should be understood that in another embodiment, 3T1C computing cells may be configured into multiple columns (i.e., 2K columns). It should also be understood that in another embodiment, more than three rows may be provided. Also, while the 3T1C DRAM computing-cell configuration depicted in FIG. 2A provides a NOR logic operation, it should be understood that the NOR logic operation of the 3T1C DRAM computing-cell topography 201 may be utilized to provide functional operations, such as, but not limited to, exclusive NOR (XNOR), addition (ADD), select (SET), MAX, SIGN, multiplex (MUX), conditional-sum addition logic (CSA), multiply, popcount, and COMPARE. The shift arrays 108 and 112 also provide a shifting function.

FIG. 2B depicts an alternative example embodiment of a one-transistor, one-capacitor (1T1C) DRAM computing-cell topography 202 that may be used for a computing cell in the computing cell array 107 of FIG. 1. As depicted in FIG. 2B, a 1T1C DRAM computing cell includes a transistor $T_4$ that has a source terminal that is electrically connected to a first terminal of a capacitor $C_2$, a drain terminal that is electrically connected to a bit line (BL), and a gate terminal that is electrically connected to a word line (WL). A second terminal of the capacitor $C_2$ is electrically coupled to a ground line. The bit line BL is electrically coupled to an input of a sense amplifier SA. An output of the sense amplifier SA is electrically coupled to a first input of a multiplexer (MUX), a drain terminal of a transistor $T_5$, and an input to an arithmetic logic unit (ALU). An output of the MUX is electrically coupled to an input of a latch (LATCH). A source terminal of the transistor T5 is electrically coupled to the output of the LATCH. An output of the ALU is electrically coupled to a second input of the MUX. The transistor T5, the MUX, the LATCH and the ALU in FIG. 2B each respectively receive control signals CNTL1-CNTL4 from the controller 114. In one embodiment, the ALU may be configured to provide a NOR function. Although the logic circuitry that is electrically coupled to the bit line BL in FIG. 2B provides a NOR logic operation, it should be understood that the logic circuitry that is electrically coupled to the bit line BL, i.e., the ALU, may provide other functional operations, such as, but not limited to, exclusive NOR (XNOR), addition (ADD), select (SET), MAX, SIGN, multiplex (MUX), conditional-sum addition logic (CSA), multiply, popcount, and COMPARE. The shift arrays 108 and 112 also provide a shifting function. It should be understood that only one 1T1C computing cell is depicted in FIG. 2B and that multiple columns and rows of 1T1C computing cells may be provided.

As can be seen in FIGS. 2A and 2B, the computing cells of a DPU do not include specific, complicated computing logics, but instead includes relatively simple topography having a re-programmable nature that provides the ability to perform multiple, different types of computations. Additionally, the topography of a DPU may be arranged to take advantage of massive parallelisms that are inherent in a memory structure to perform more computations faster and more efficiently.

Figure 3:
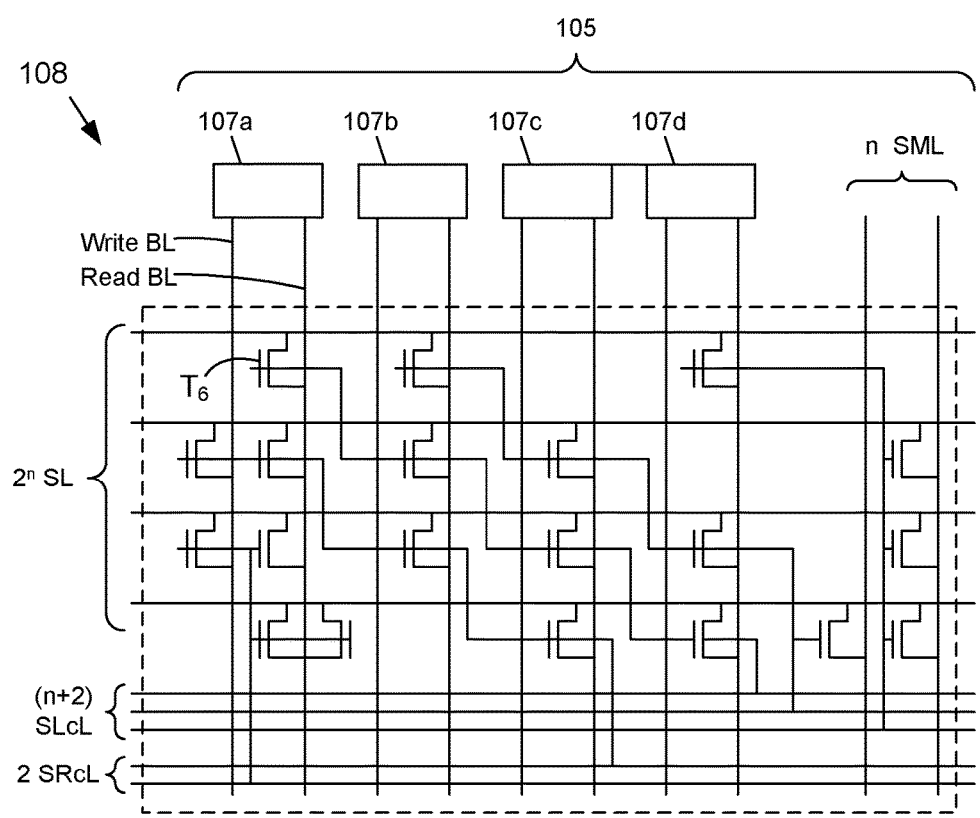
FIG. 3 depicts an example embodiment of an intra-mat shift array according to the subject matter disclosed herein.

FIG. 3 depicts an example embodiment of an intra-mat shift array 108 according to the subject matter disclosed herein. In order to simplify a description of the intra-mat shifting array 108, consider a mat 105 that is four columns of computing cells 107 wide, such as that depicted in FIG. 3. The intra-mat shifting array 108 includes a plurality of transistors $T_6$ (of which only one transistor $T_6$ is indicated in FIG. 3) arranged in an array, $2^n$ shift lines SLs (in which n is the columns of computing cells in the mat 105), n +2 shift left control lines SLcLs, 2 shift right control lines SRcLs and n shift mask lines SMLs. Some of the transistors $T_6$ of the intra-mat shift array 108 are electrically connected between Write BLs and the $2^n$ shift lines SLs, and other transistors $T_6$ of the intra-mat shift array 108 are connected between Read BLs and the $2^n$ shift lines SLs. The gates of these transistors $T_6$ are electrically coupled to the n +2 shift left control lines SLcLS and the 2 shift right control lines SRcLS. Other transistors $T_6$ of the intra-mat shift array are electrically connected between the n shift mask lines SMLs and the 2 shift lines SLs. The control lines of the intra-mat shift array 108 are electrically coupled to a sub-array controller 114 associated with the mat 105.

The intra-mat shifting array 108 may shift data left or right within a mat 105 by appropriate signals on the control lines SLcLs and SRcLs. For left shifting, data may be filled with a sign bit, and shifted either 1 bit or (n−1) bits per operation in which n is the number of columns per mat 105. For right shifts, data may be filled with either 0 or 1 as controlled by instructions, and shifted $2^0, 2^1, \ldots, 2^{k-1}, 2^k$ up to the number of columns per MAT in which $2^k$ is the number of columns.

Figure 4A:
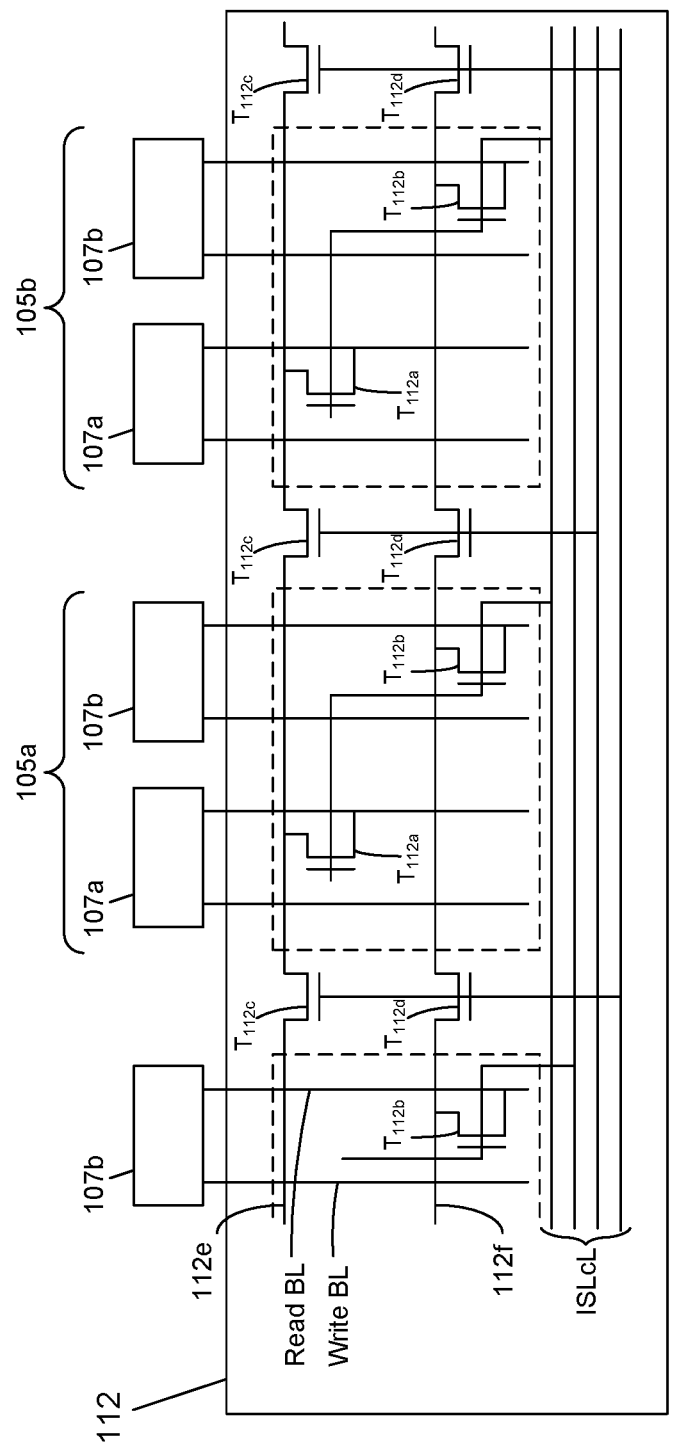
FIG. 4A depicts an embodiment of an inter-mat shift array according to the subject matter disclosed herein.
Figure 4B:
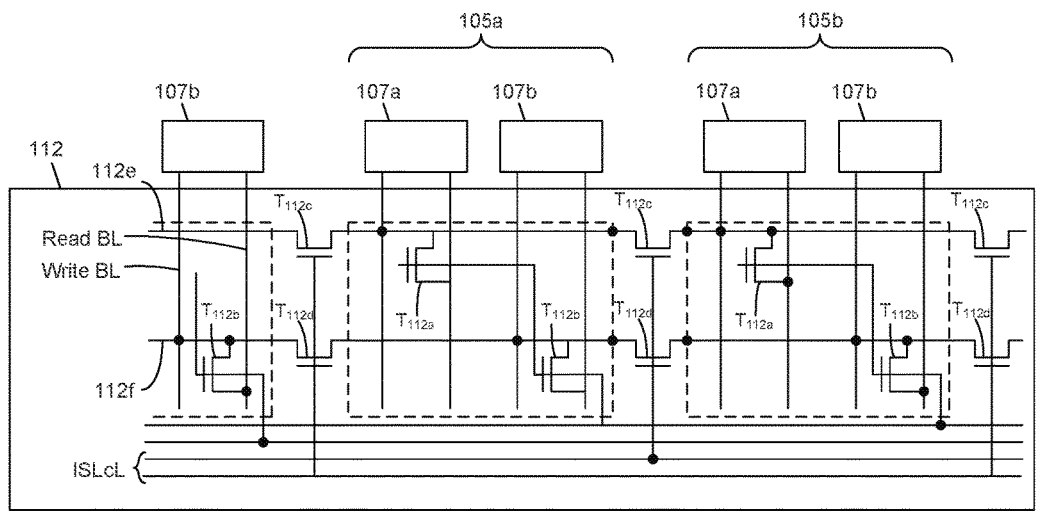
FIG. 4B conceptually depicts an inter-mat shift interconnection configuration between two identically positioned computing cell in adjacent computing-cell columns for a left inter-mat shift according to the subject matter disclosed herein.
Figure 4C:
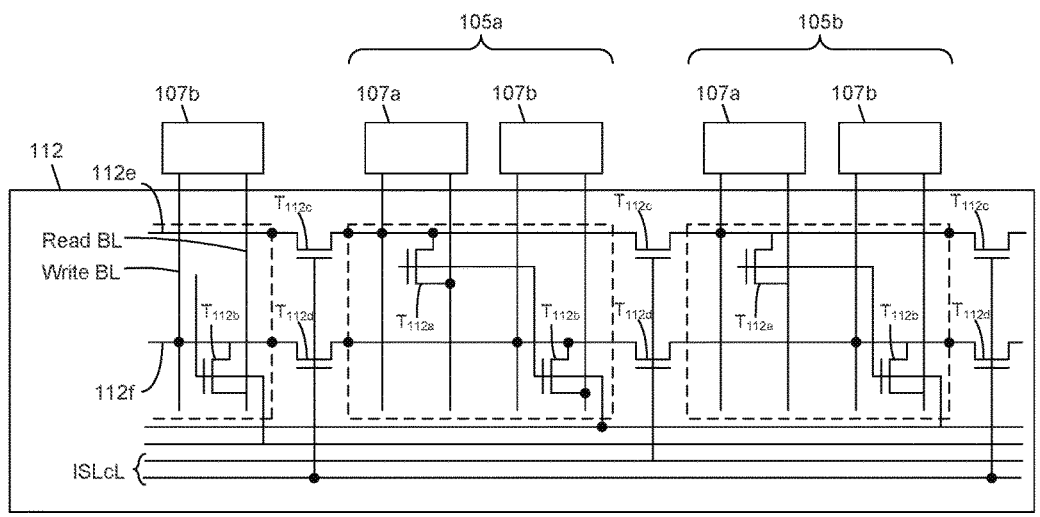
FIG. 4C conceptually depicts an inter-mat shift interconnection configuration between two non-identically positioned computing cell in adjacent computing-cell columns for a left inter-mat shift according to the subject matter disclosed herein.

FIG. 4A depicts an embodiment of an inter-mat shift array 112 according to the subject matter disclosed herein. In order to simplify a description of the inter-mat shift array 112, consider a configuration in which the mats 105 are two columns of computing cells 107 wide, such as depicted in FIGS. 4A-4C. That is, each mat 105 includes a first column of computing cells 107a and a second column of computing cells 107b. The inter-mat shift array 112 includes transistors $T_{112a}$ and $T_{112b}$, transistors $T_{112c}$ and $T_{112d}$, data shift lines 112e and 112f, and inter-mat shift control lines ISLcLs. Within a mat, the transistor $T_{112a}$ includes a source terminal that is electrically coupled to a Read BL of the first column of computing cells 107a, a drain terminal that is electrically coupled to the data shift line 112e. The transistor $T_{111b}$ includes a source terminal that is electrically coupled to a Read BL of the second column of computing cells 107b, a drain terminal that is electrically coupled to the data shift line 112f. Data shift lines 112e and 112f are electrically coupled to the buffer 103 (not shown in FIG. 4A). Between the different mats, the transistor $T_{112c}$ includes source and drain terminals that are respectively electrically coupled to the data shift lines 112e in adjacent mats. The transistor $T_{112d}$ includes source and drain terminals that are respectively electrically coupled to the data shift lines 112f in adjacent mats. The gates of the transistors $T_{112c}$ and $T_{112d}$ are respectively electrically coupled to respectively different inter-mat shift control lines ISLcLs. The inter-mat shifting array 112 may shift data left or right between different mats by appropriate signals on the control lines ISLcLs. The control lines of the inter-mat shift array 112 are electrically coupled to a sub-array controller 114 associated with the mat 105.

FIG. 4B conceptually depicts an inter-mat shift interconnection configuration between two identically positioned computing cell in adjacent computing-cell columns 105a and 105b for a left inter-mat shift according to the subject matter disclosed herein. The interconnection configuration of FIG. 4B may be conceptually depicted by operative interconnection nodes that are emphasized. For example, the transistors $T_{112c}$ and $T_{112d}$ are activated so that a conductive path exists between each transistor, thereby connecting the data shift lines 112e and 112f between computing-cell columns 105a (on the left) and 105b (on the right). The gate terminals of the transistors $T_{112c}$ and $T_{112d}$ are electrically connected to an active inter-mat shift control line ISLcL. The transistors $T_{112a}$ and $T_{112b}$ in the mat 105b are activated so that the Read BL of the computing cell 107a in mat 105b is electrically connected to the Write BL of the computing cell 107a in the mat 105a to the left of the mat 102b, and so that the Read BL of the computing cell 107b in the mat 105b is electrically connected to the Write BL of the computing cell 107a in the mat 105a to the left of the mat 105b.

FIG. 4C conceptually depicts an inter-mat shift interconnection configuration between two non-identically positioned computing cell in adjacent computing-cell columns 105a and 105b for a left inter-mat shift according to the subject matter disclosed herein. The interconnection configuration of FIG. 4C may be conceptually depicted by operative interconnection nodes that are emphasized. For example, the transistors $T_{112c}$ and $T_{112d}$ are activated so that a conductive path exists between each transistor, thereby connecting the data shift lines 112e and 112f between computing-cell columns 105a (on the right) and 105b (on the left). The gate terminals of the transistors $T_{112c}$ and $T_{112d}$ are electrically connected to an active inter-mat shift control line ISLcL. The transistors $T_{112a}$ and $T_{112b}$ in mat 105a are activated so that the Read BL of the computing cell 107a in mat 105a is electrically connected to the Write BL of the computing cell 107a in the mat 105b to the left of the mat 105a, and so that the Read BL of the computing cell 107b in the mat 105a is electrically connected to the Write BL of the computing cell 107a in mat 105b to the left of the mat 105a.

Figure 5:
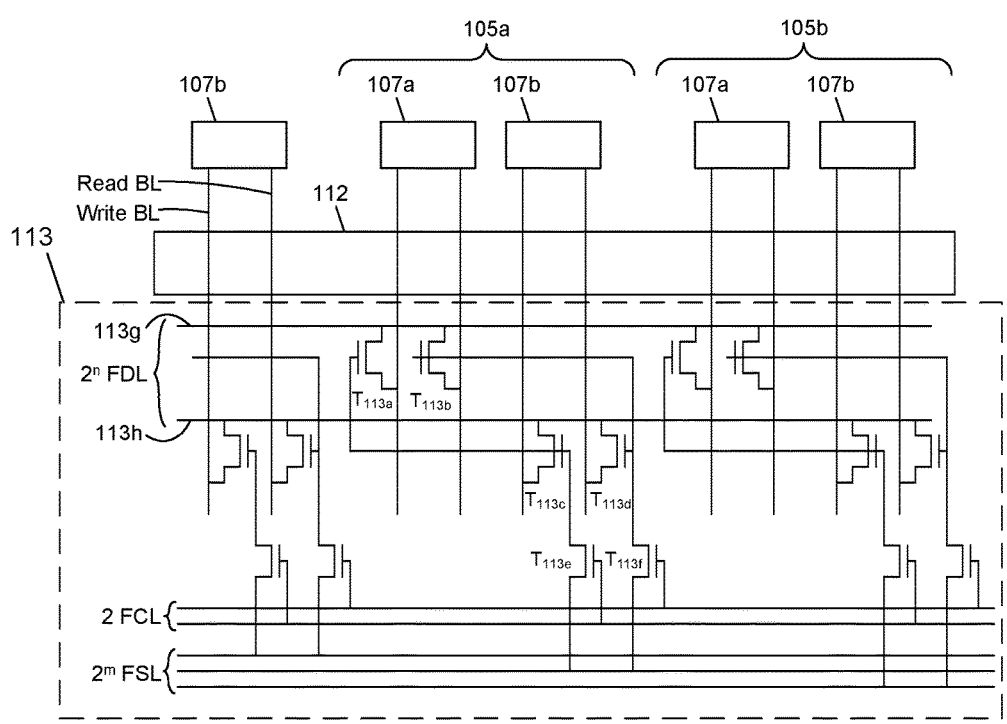
FIG. 5 depicts an embodiment of an inter-mat forwarding array according to the subject matter disclosed herein.

FIG. 5 depicts an embodiment of an inter-mat forwarding array 113 according to the subject matter disclosed herein. In order to simplify a description of the inter-mat forwarding array 113, consider a configuration in which mats 105 are two columns of computing cells 107 wide, such as depicted in FIG. 5. That is, each mat 105 includes a first column of computing cells 107a and a second column of computing cells 107b. With a mat 105, the inter-mat forwarding array 113 transistors $T_{113a}$ and $T_{113b}$, transistors $T_{113c}$ and $T_{113d}$, and transistors $T_{113e}$ and $T_{113f}$, $2^n$ data forwarding lines FDL (in which n is the number of computing-cell columns in a mat), forwarding control lines FCL, and $2^m$ forwarding section lines FSL (in which m is the number of sections). The source terminals of the transistors $T_{113a}$ and $T_{113b}$ are respectively electrically connected the Write BL and the Read BL of the first column of computing cells 107a. The drain terminals of the transistors $T_{113a}$ and $T_{113b}$ are electrically coupled to a first data forwarding line FDL 113g. The source terminals of the transistors $T_{113c}$ and $T_{113d}$ are respectively electrically connected the Write BL and the Read BL of the second column of computing cells 107b. The drain terminals of the transistors $T_{113a}$ and $T_{113b}$ are electrically coupled to a second data forwarding line FDL 113h. The source terminals of the transistors $T_{113e}$ and $T_{113f}$ are respectively electrically coupled to the gate terminals of the transistors $T_{113a}$ and $T_{113b}$. The drain terminals of the transistors $T_{113e}$ and $T_{113f}$ are both coupled to the same forwarding second lines FSL. The gate terminals of the transistors $T_{113e}$ and $T_{113f}$ are respectively coupled to different forwarding control lines FCLs. The inter-mat forwarding array 113 may forward data between mats by appropriate signals on the forwarding direction control lines FCLs. The control lines of the inter-mat forwarding array 113 are electrically coupled to the sub-array controllers 114 that are associated with the mats 105 between which data is being forwarded.

FIGS. 6A-6G depict NOR-logic-based operations that may be provided by a DPU according to the subject matter disclosed herein. In FIGS. 6A-6G, a first operand may be stored in Row X and a second operand may be stored in Row Y or a Row W. The arrows in FIG. 6A-6G represent the input and output flows of the NOR logic operation for an entire row of computing cells. For example, Row X in FIG. 6A may represent an entire row of operands stored in computing cells of Row X. The results of the NOR logic operation on the operands stored in Row X and the operands stored in Row Y are stored in result Row R. In one embodiment, the operands in Row X and Row y may include, for example, 100 columns (i.e., $x_1, x_2, \ldots, x_{100}$ and $y_1, y_2, \ldots y_{100}$) and the result may be stored in Row R (i.e., $r_1, r_2, \ldots r_{100}$). That is, $x_i$ nor $y_i = r_i$ in which i is a column index. In another embodiment, Row X may represent only a selected group of the computing cells in a row.

Figure 6A:
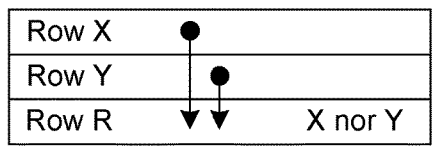
FIGS. 6A-6G depict NOR-logic-based operations that may be provided by a DPU according to the subject matter disclosed herein.
Figure 6B:
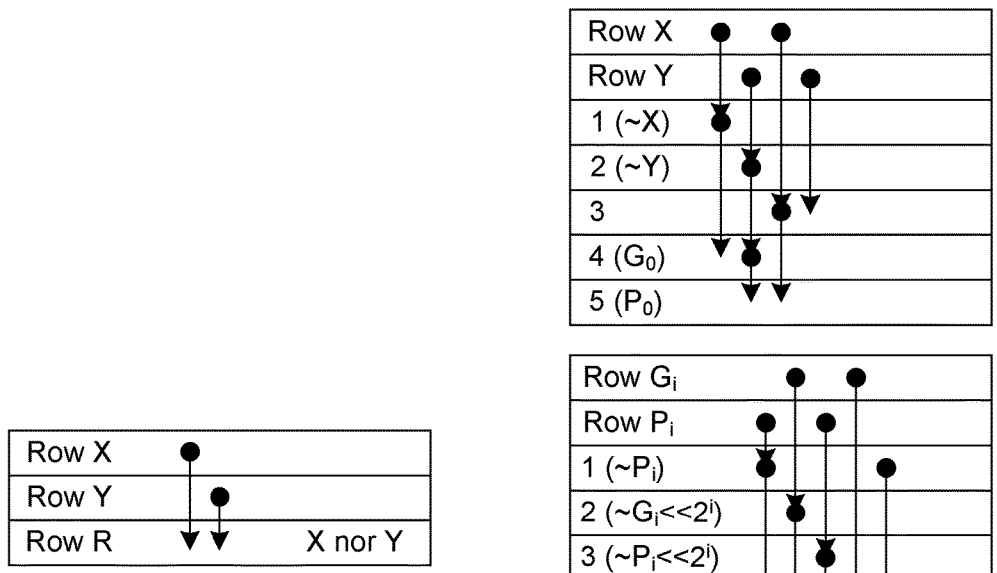

FIG. 6B depicts an example full adder operation for an N-bit number that is based on a prefix Kogge-Stone adder. In FIG. 6B, a first N-bit operand is stored in Row X and a second N-bit operand is stored in Row Y. For the example addition operation depicted in FIG. 6B, intermediate terms $G_0, P_0, G_1, P_1, G_2, P_2, \ldots, G_{log\ N+1}$ and $P_{log\ N+1}$ are calculated. The upper-most block of FIG. 6B represents five separate operations that determine $G_0$ and $P_0$ using the input operands from Rows X and Y. In the first operation the upper-most block determines the inverse of Row X (i.e., ~X), which is stored in Row 1. The second operation determines the inverse of Row Y (i.e., ~Y), which is stored in Row 2. The third operation determines the operation Row X NOR Row Y, which is stored in Row 3. The fourth operation determines the operation $G_0$=Row 1 NOR Row 2, which is stored in Row 4. The fifth operation determines $P_0$=Row 3 NOR Row 4, which is stored in Row 5.

In the middle block of FIG. 6B, the intermediate results $G_0$ and $P_0$ from the upper-most block are used to determine the intermediate results $G_{i+1}$ and $P_{i+1}$ in which i is a column index. That is, the intermediate results $G_0$ and $P_0$ determined in the upper-most block of FIG. 6A are used to determine the intermediate results $G_1$ and $P_1$. The intermediate results $G_1$ and $P_1$ are used to determine the intermediate results $G_2$ and $P_2$, and so on to determine the intermediate results $G_{log\ N+1}$ and $P_{log\ N+1}$. In the bottom-most block of FIG. 6B, the result Rows R1 and R2 respectively store a carry result and the sum result for the full adder operation.

Figure 6C:
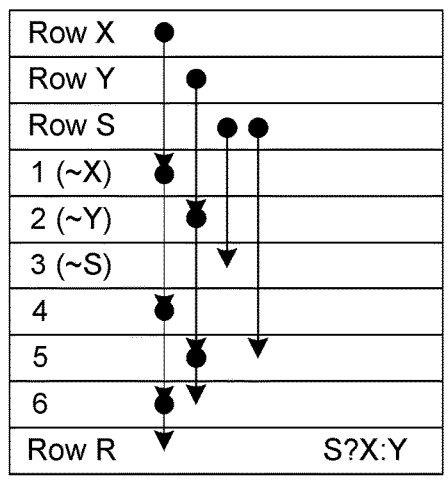

FIG. 6C depicts an example selector operation that may be provided by the 3T1C DRAM computing-cell topography 201. Row 1 stores the intermediate result of the inverse of Row X (i.e., ~X). Row 2 stores the intermediate result of the inverse of Row Y (i.e., ~Y). Row 3 stores the intermediate result of the inverse of Row S (i.e., ~S). Row 4 stores the intermediate result of Row 1 NOR Row 3. Row 5 stores the intermediate result of Row 2 NOR Row S. Row 6 stores the intermediate result of Row 4 NOR Row 5. Row R stores the result of the inverse of Row 6, that is, S?X:Y.

Figure 6D:
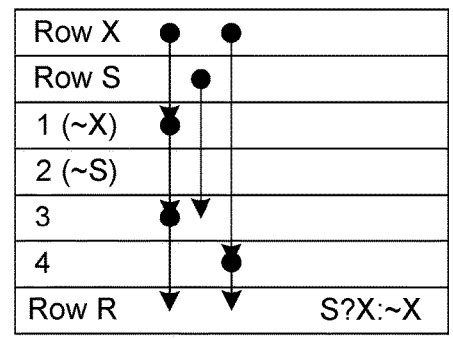

FIG. 6D depicts an alternative example selector operation that may be provided by the 3T1C DRAM computing-cell topography 201. Row 1 stores the intermediate result of the inverse of Row X (i.e., ~X). Row 2 stores the intermediate result of the inverse of Row S (i.e., ~S). Row 3 stores the intermediate result of Row 1 NOR Row 3. Row 4 stores the intermediate result of the inverse of Row X (i.e., ~X). Row R stores the result of Row 3 NOR Row 4, that is, S?X:~X.

Figure 6E:
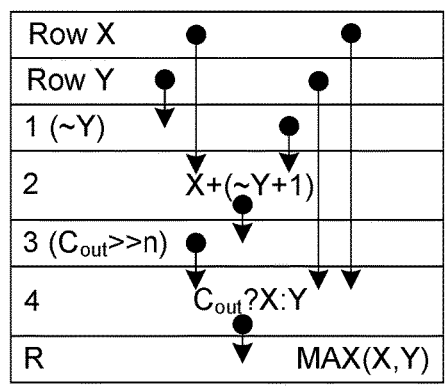

FIG. 6E depicts an example MAX/MIN operation that may be provided by the 3T1C DRAM computing-cell topography 201. Row 1 stores the intermediate result of the inverse of Row Y (i.e., ~Y). Row 2 stores the intermediate result of Row X+(~Y+1). Row 3 stores the intermediate result of $C_{out}$>>n. Row 4 stores the intermediate result of $C_{out}$?X:Y. Row R stores the result of MAX(X:Y).

Figure 6F:
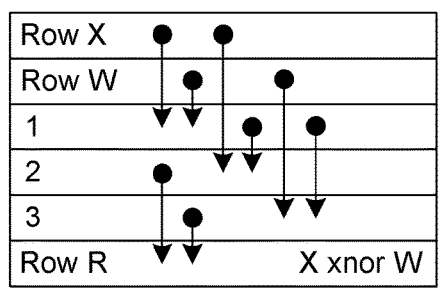

FIG. 6F depicts an example 1-bit multiply operation that may be provided by the 3T1C DRAM computing-cell topography 201. Row 1 stores the intermediate result of Row X NOR Row W. Row 2 stores the intermediate result of Row X NOR Row 1. Row 3 stores the intermediate result of Row W NOR Row 1. The result Row R stores that result of Row 2 NOR Row 3, that is, the result of Row X XNOR Row W.

Figure 6G:
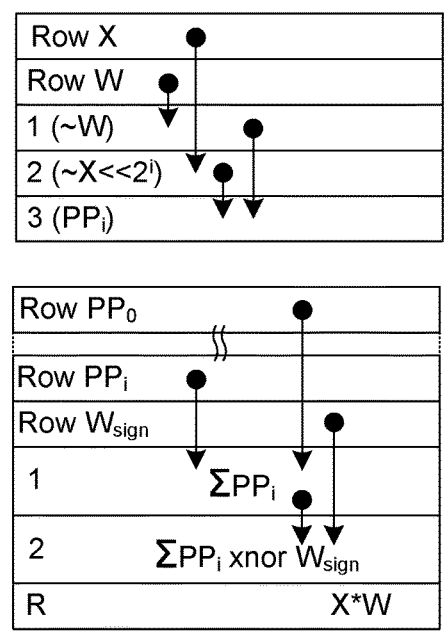

FIG. 6G depicts an example multiple-bit multiplication operation that may be provided by the 3T1C DRAM computing-cell topography 201. In the upper block of FIG. 6G, Row 1 stores the intermediate result of the inverse of Row W (i.e., ~W). Row 2 stores the intermediate results of the inverse of Row X shifted left $2^i$ times (i.e., ~X<<$2^i$) in which i is an index. Row 3 stores the intermediate results of Row 1 NOR Row 2, that is, $PP_i$=~W NOR~X<<$2^i$. In the lower block of FIG. 6G, Row 1 stores the intermediate result of Row $PP_0$ SUM Row $PP_i$, that is $\Sigma PP_i$. Row 2 stores the intermediate result of Row 2 NOR Row $W_{sign}$. Row R stores the result of X*W.

Figure 7:
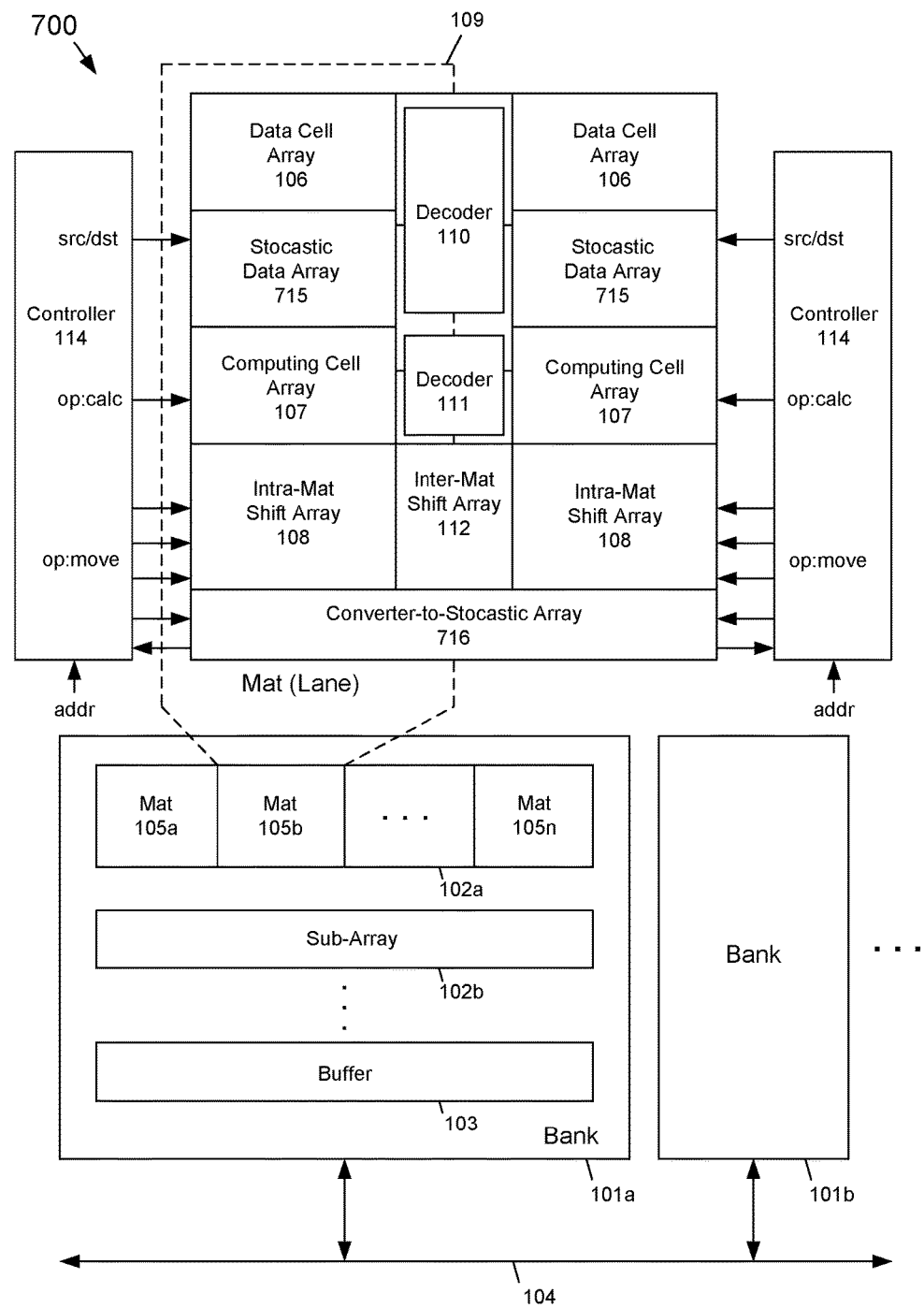
FIG. 7 depicts a block diagram of an example embodiment of a DPU that includes a stochastic data region according to the subject matter disclosed herein.

FIG. 7 depicts a block diagram of an example embodiment of a DPU 700 that includes a stochastic data region 715 according to the subject matter disclosed herein. The various components of DPU 700 that have the same reference indicators as the components of the DPU 100 depicted in FIG. 1 are similar and a description of such similar components has been omitted here. A sub-array 102 of the DPU 700 includes a stochastic data array 715 and a converter-to-stochastic array 716, along with a (real) data cell array 106, a computing cell array 107 and an intra-mat shift array 108.

Each stochastic data array 715 may include one or more stochastic computing cells that are arranged in at least one column and at least one row. The number of columns in the stochastic data array 715 is the same as the number of columns in the data cell array 106 and the computing cell array 107. In one embodiment, a stochastic data array 715 may include 2K columns and 16 rows. In another embodiment, a stochastic data array 715 may include fewer or more than 2K columns and/or fewer or more than 16 rows. In a stochastic data array 715, the probability of the presence of "1" is used and $2^n$-bit is used to represent an n-bit value. A random number generator in the converter-to-stochastic array 716 may be used to convert a real number to a stochastic number. A popcount operation may be used to convert a stochastic number back to a real number.

Figure 8A:
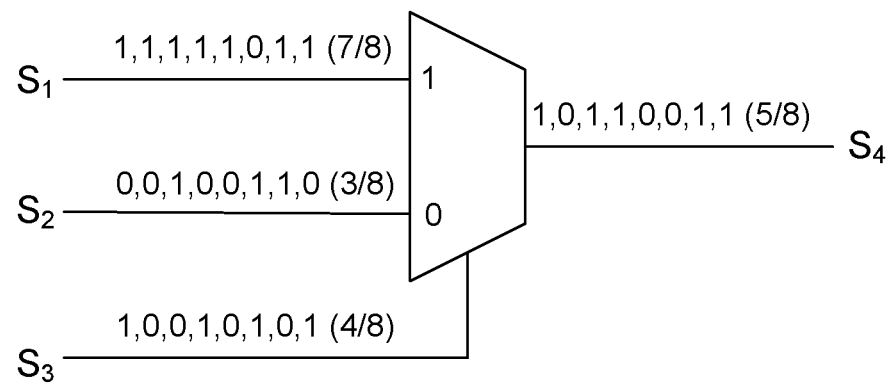
FIGS. 8A and 8B respectively depict stochastic computing operations for an addition operation that may be converted to a multiplexing operation and multiplication operation that may be converted to an AND logic operation.
Figure 8B:
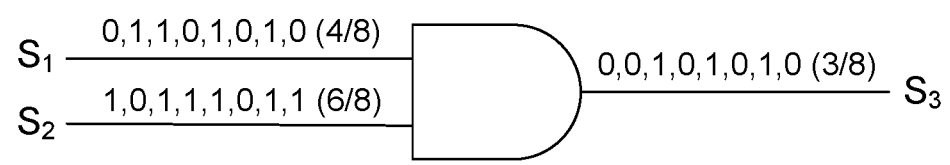

By using a stochastic computing approach, addition may be converted to a multiplexing operation and multiplication may be converted to an AND logic operation. For example, FIG. 8A depicts a circuit that provides a stochastic addition operation as a multiplexing operation, and FIG. 8B depicts a circuit that provides a stochastic multiplication operation as an AND logic operation. Conventional techniques for stochastic computing requires an enormous memory capacity; however, the subject matter disclosed herein may be used to provide highly efficient stochastic computing because the DRAM-based DPUs are able to perform large parallel AND and MUX operations. Stochastic computing using the DPUs disclosed herein also makes it possible to accelerate complex operations in which deep learning is a typical application.

Figure 9:
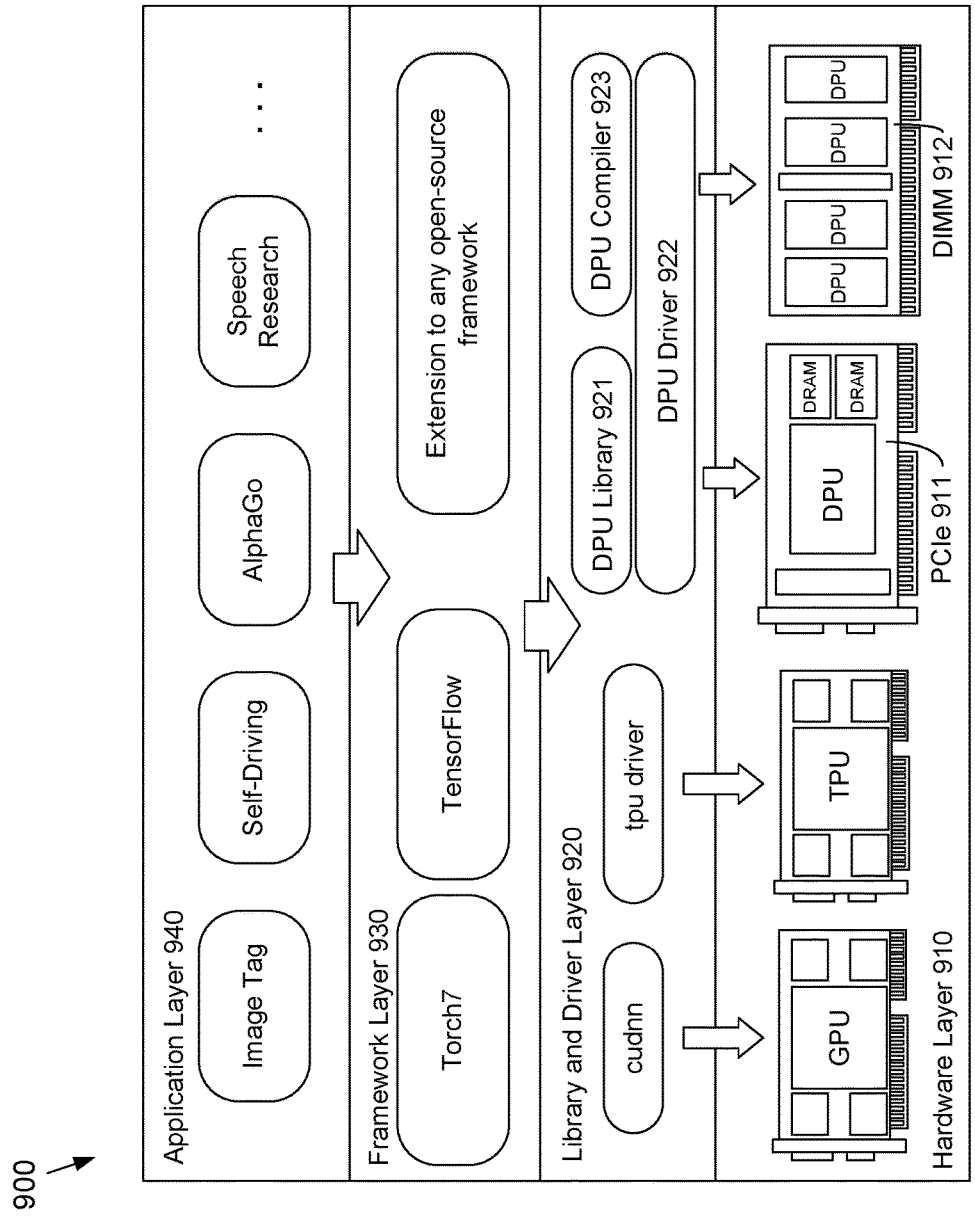
FIG. 9 depicts a system architecture that includes DPUs according to the subject matter disclosed herein.

FIG. 9 depicts a system architecture 900 that includes DPUs according to the subject matter disclosed herein. The system architecture 900 may include a hardware layer 910, a library and driver layer 920, a framework layer 930, and an application layer 940.

The hardware layer 910 may include hardware devices and/or components that have embedded DPUs, such as the DPUs described herein. One embodiment of a device and/or a component may be a Peripheral Component Interconnect Express (PCIe) device 911 that may include one or more embedded DPUs. Another embodiment of a device and/or a component may be a Dual In-line Memory Module (DIMM) 912 that may include one or more embedded DPUs. It should be understood that the hardware layer 910 of system architecture 900 is not limited to PCIe devices and/or DIMMs, but may include System on a Chip (SOC) devices or other memory-type devices that may contain DPUs. The DPUs that may be embedded in the devices and/or components at the hardware level 910 may be configured to be similar to DPU 100 in FIG. 1 and/or similar to DPU 700 in FIG. 7. In any embodiment, particular computing cell arrays of a DPU may be configured to include a 3T1C computing-cell topography 201 (FIG. 2A) or a 1T1C computing-cell topography 202 (FIG. 2B).

The library and driver layer 920 of system architecture 900 may include a DPU library 921, a DPU driver 922 and a DPU compiler 923. The DPU library 921 may be configured to provide optimal mapping functionality, resource allocation functionality and scheduling functionality for each sub-array in a DPU in the hardware layer 910 for different applications that may operate at the application layer 940.

In one embodiment, the DPU library 921 may provide a high-level application programming interface (API) for the framework layer 930 that may include operations such as move, add, multiply, etc. For example, the DPU library 921 may also include implementations for standard-type routines, such as, but not limited to, forward and backward convolution, pooling, normalization, and activation layers that may be applicable for an accelerated deep learning process. In one embodiment, the DPU library 921 may include an API-like function that maps a calculation for a whole convolution layer of a convolution neural network (CNN). Additionally, the DPU library 921 may include API-like functions for optimizing a mapping of a convolution layer calculation onto DPU.

The DPU library 921 may also include API-like functions for optimizing resource allocation by mapping any individual or multiple parallelisms within a task (batch, output channel, pixels, input channels, convolution kernels) into corresponding DPU parallelisms at the chip, bank, sub-array and/or mat level. Additionally, the DPU library 921 may include API-like functions that provide optimal DPU configuration at initialization and/or runtime that trades off performance (i.e., data movement flow) and power consumption. Other API-like functions provided by the DPU library 921 may include design-knob-type functions, such as, setting the number of active subarrays per bank, the number of input feature maps per active subarrays, a partitioning of a feature map, and/or a reuse scheme of the convolution kernel. Still other API-like functions may provide additional resource allocation optimization by allocating for each subarray a specific task, such as convolution computing, channel sum up, and/or data dispatching. If operands are to be converted between an integer and a stochastic number, the DPU library 921 includes API-like functions that minimize the overhead while meeting precision constraints. In the event that the precision is lower than expected, the DPU library 921 may include API-like functions that either compute the value again using additional bits for a stochastic representation, or offload the task to other hardware, such as a CPU.

The DPU library 921 may also include API-like functions that simultaneously schedule activated sub-arrays in a DPU, and schedule data movement so that it is hidden by computing operations.

Another aspect of the DPU library 921 includes an extension interface for further DPU development. In one embodiment, the DPU library 921 may provide an interface to directly program functionality using NOR and shift logic so that operations other than standard-type operations (i.e., add, multiply, MAX/MIN, etc.) may be provided. The extension interface may also provide an interface so that an operation that is not specifically supported by the DPU library 921 may be offloaded at the library and driver layer 920 to a SoC controller (not shown), a central processing unit/graphics processing unit (CPU/GPU) component and/or a CPU/Tensor Processing Unit (CPU/TPU) component. Yet another aspect of the DPU library 921 provides an API-like function to use the memory of a DPU as an extension of memory when the DPU memory is not being used for computing.

The DPU driver 922 may be configured to provide an interface connection between a DPU at the hardware layer 910, the DPU library 921, and an operating system (OS) at a higher layer to integrate the DPU hardware layer into a system. That is, the DPU driver 922 exposes a DPU to a system OS and DPU library 921. In one embodiment, the DPU driver 922 may provide DPU control at initialization. In one embodiment, the DPU driver 922 may send instructions in the form of DRAM-type addresses or sequences of DRAM-type addresses to a DPU and may control data movement into and out of a DPU. The DPU driver 922 may provide multi-DPU communication along with handling DPU-CPU and/or DPU-GPU communications.

The DPU compiler 923 may compile the DPU code from the DPU library 921 into DPU instructions in the form of memory addresses that are used by the DPU driver 922 to control a DPU. The DPU instructions generated by the DPU compiler 923 may be single instructions that operate on one and/or two rows in a DPU; vector instructions, and/or gathered vector, read-on-operation instructions.

The framework layer 930 may be configured to provide a user-friendly interface to the library and driver layer 920 and the hardware layer 910. In one embodiment, the framework layer 930 may provide a user-friendly interface that is compatible to a wide range of applications at the application layer 940 and makes the DPU hardware layer 910 transparent to a user. In another embodiment, the framework layer 930 may include framework extensions that add quantitation functions to existing, conventional methods, such as, but not limited to, Torch7-type applications and TensorFlow-type applications. In one embodiment, the framework layer 903 may include adding quantitation functions to a training algorithm. In another embodiment, the framework layer 930 may provide an override to existing batch-normalization methods of divide, multiply and square root to be shift approximated methods of divide, multiply and square root. In still another embodiment, the framework layer 930 may provide an extension that allows a user to set the number of bits used for a calculation. In yet another embodiment, the framework layer 930 provides the capability to wrap multi-DPU API from the DPU library and driver layer 920 to the framework layer 930, so that a user may use multiple DPUs at the hardware layer similar to a use of multiple GPUs. Still another feature of the framework 930 allows a user to assign functions to either a DPU or a GPU at the hardware layer 910.

The application 940 may include a wide range of applications, such as, but not limited to image tag processing, self-driving/piloting vehicles, AlphaGo-type deep-mind applications and/or speech research.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A dynamic random access memory (DRAM) processing unit (DPU), comprising:
   at least one computing cell array comprising a plurality of DRAM-based computing cells arranged in an array having at least a first predetermined number of columns and a second predetermined number of rows in which the first predetermined number is greater than or equal to three and the second predetermined number is greater than or equal to three, each column being configured to provide a DPU operation comprising a logic function that digitally operates on a first and a second row of the column and being configured to store a result of the logic function in a third row of the column, the at least one computing cell array further comprising a third predetermined number of shift lines in which the third predetermined number is two times the first predetermined number, each shift line being coupled to a column of computing cells through at least one corresponding first transistor, the shift lines and the corresponding first transistors being configured to shift contents of two rows of computing cells of a selected column at least two columns in a right direction or in a left direction in the at least one computing cell array; and
   a controller coupled to the at least one computing cell array to configure the at least one computing cell array to perform the DPU operation.

2. The DPU of claim 1, wherein the controller receives instructions for the DPU operation over an address bus.

3. The DPU of claim 1, wherein the DRAM-based computing cells of at least one column each comprising a three transistor, one capacitor (3T1C) DRAM memory cell.

4. The DPU of claim 3, wherein the DRAM-based computing cells of at least one column provide a NOR logic function.

5. The DPU of claim 1, wherein the DRAM-based computing cells of at least one column each comprising a one transistor, one capacitor (1T1C) DRAM memory cell.

6. The DPU of claim 5, wherein each DRAM-based computing cell further comprising an arithmetic logic unit (ALU) coupled to a bit line of the DRAM-based computing cell, the ALU providing the logic function.

7. The DPU of claim 6, wherein the ALU provides a NOR logic function.

8. The DPU of claim 1, further comprising:
   at least one memory cell array comprising at least one DRAM-based memory cell arranged in the first predetermined number of columns, each column of DRAM-based memory cells of at least one data cell array corresponding to a column of a corresponding computing cell array; and
   a sense amplifier coupled to each column of computing cells, each sense amplifier comprising an input that is electrically coupled to a read bit line of the computing cells of the column and an output that is electrically coupled to a write bit line of the computing cells of the column,
   wherein a controller is further coupled to the at least one memory cell array to configure the at least one memory cell array to perform a memory operation, and
   wherein the controller further receives instructions for the memory operation over an address bus.

9. The DPU of claim 1, further comprising:
   at least one stochastic computing cell array comprising a plurality of DRAM-based stochastic computing cells arranged in the first predetermined number of columns and the second predetermined number of rows, each column of DRAM-based stochastic computing cells of at least one data cell array corresponding to a column of a corresponding computing cell array, each column being configured to provide a stochastic logic function that operates on a first stream of data received by a first row and a second stream of data received by a second row of the column and configured to store a stream of data resulting from the stochastic logic function in a third row of the column,
   wherein a controller is further coupled to the at least one stochastic computing cell array to configure the at least one stochastic computing cell array to perform a stochastic logic operation corresponding to the stochastic logic function, and
   wherein the controller further receives instructions for the stochastic logic operation over an address bus.

10. A dynamic random access memory (DRAM) processing unit (DPU), comprising:
    at least one computing cell array comprising a plurality of DRAM-based computing cells arranged in an array having at least a first predetermined number of columns and a second predetermined number of rows in which the first predetermined number is greater than or equal to three and the second predetermined number is greater than or equal to three, each column being configured to provide a logic function that digitally operates on a first row and a second row of the column and configured to store a result of the logic function in a third row of the column, the at least one computing cell array further comprising a third predetermined number of shift lines in which the third predetermined number is two times the first predetermined number, each shift line being coupled to a column of computing cells through at least one corresponding first transistor, the shift lines and the corresponding first transistors being configured to shift contents of two rows of computing cells of a selected column at least two columns in a right direction or in a left direction in the at least one computing cell array;

at least one data cell array comprising at least one DRAM-based memory cell arranged in the first predetermined number of columns, each column of DRAM-based memory cells of at least one data cell array corresponding to a column of a corresponding computing cell array; and a controller coupled to the at least one computing cell array to configure the at least one computing cell array to perform a DPU operation and coupled to the at least one data cell array to perform a memory operation.

11. The DPU of claim 10, wherein the controller receives instructions for the DPU operation over an address bus.

12. The DPU of claim 10, wherein the DRAM-based computing cells of at least one column each comprising a three transistor, one capacitor (3T1C) DRAM memory cell, and wherein the DRAM-based computing cells of at least one column provide a NOR logic function.

13. The DPU of claim 10, wherein the DRAM-based computing cells of at least one column each comprising a one transistor, one capacitor (1T1C) DRAM memory cell, and wherein each DRAM-based computing cell further comprising an arithmetic logic unit (ALU) coupled to a bit line of the DRAM-based computing cell, the ALU providing the logic function.

14. The DPU of claim 13, wherein the ALU provides a NOR logic function.

15. The DPU of claim 10, further comprising:

at least one stochastic computing cell array comprising a plurality of DRAM-based stochastic computing cells arranged in the first predetermined number of columns and the second predetermined number of rows, each column of DRAM-based stochastic computing cells of at least one data cell array corresponding to a column of a corresponding computing cell array, each column being configured to provide a stochastic logic function that operates on a first stream of data received by a first row and a second stream of data received by a second row of the column and configured to store a stream of data resulting from of the stochastic logic function in a third row of the column, wherein a controller is further coupled to the at least one stochastic computing cell array to configure the at least one stochastic computing cell array to perform a stochastic logic operation, and wherein the controller further receives instructions for the stochastic logic operation over an address bus.

16. The DPU of claim 15, wherein the DRAM-based stochastic computing cells of at least one column each comprise a three transistor, one capacitor (3T1C) DRAM memory cell, or a one transistor, one capacitor (1T1C) DRAM memory cell.

17. A dynamic random access memory (DRAM) processing unit (DPU), comprising:

at least one computing cell array comprising a plurality of DRAM-based computing cells arranged in an array having at least a first predetermined number of columns and a second predetermined number of rows in which the first predetermined number is greater than or equal to three and the second predetermined number is greater than or equal to three, each column being configured to provide a logic function that digitally operates on a first row and a second row of the column and configured to store a result of the logic function in a third row of the column, the at least one computing cell array further comprising a third predetermined number of shift lines in which the third predetermined number is two times the first predetermined number, each shift line being coupled to a column of computing cells through at least one corresponding first transistor, the shift lines and the corresponding first transistors being configured to shift contents of two rows of computing cells of a selected column at least two columns in a right direction or in a left direction in the at least one computing cell array;

at least one stochastic computing cell array comprising a plurality of DRAM-based stochastic computing cells arranged in the first predetermined number of columns and the second predetermined number of rows, each column of DRAM-based stochastic computing cells of at least one data cell array corresponding to a column of a corresponding computing cell array, each column being configured to provide a stochastic logic function that operates on a first stream of data received by a first row and second stream of data received by a second row of the column and configured to store a stream of data resulting from the stochastic logic function in a third row of the column; and a controller coupled to the at least one computing cell array to configure the at least one computing cell array to perform a DPU operation and coupled to the at least one stochastic computing cell array to perform a stochastic logic operation corresponding to the stochastic logic function.

18. The DPU of claim 17, wherein the controller receives instructions for the DPU operation over an address bus.

19. The DPU of claim 18, wherein the DRAM-based computing cells of at least one column each comprising a three transistor, one capacitor (3T1C) DRAM memory cell, and wherein the DRAM-based computing cells of at least one column provide a NOR logic function.

20. The DPU of claim 17, wherein the DRAM-based stochastic computing cells of at least one column each comprise a three transistor, one capacitor (3T1C) DRAM memory cell.

* * * * *